(12) United States Patent
Kim

(10) Patent No.: US 7,701,046 B2
(45) Date of Patent: Apr. 20, 2010

(54) STACKED TYPE CHIP PACKAGE STRUCTURE

(75) Inventor: Hyeong-No Kim, Kyunggi-Do (KR)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 55 days.

(21) Appl. No.: 11/617,738

(22) Filed: Dec. 29, 2006

(65) Prior Publication Data

US 2008/0158844 A1 Jul. 3, 2008

(51) Int. Cl.
*H01L 23/02* (2006.01)
(52) U.S. Cl. ............... 257/686; 257/687; 257/E25.006
(58) Field of Classification Search ............... 257/686, 257/687, E25.006
See application file for complete search history.

(56) References Cited

U.S. PATENT DOCUMENTS

| | | | |
|---|---|---|---|
| 6,365,963 B1 * | 4/2002 | Shimada | 257/686 |
| 6,952,047 B2 | 10/2005 | Li | |
| 2002/0079568 A1 * | 6/2002 | Degani et al. | 257/686 |
| 2002/0079572 A1 * | 6/2002 | Khan et al. | 257/707 |
| 2006/0175696 A1 * | 8/2006 | Kim | 257/686 |
| 2006/0249828 A1 * | 11/2006 | Hong | 257/686 |

* cited by examiner

*Primary Examiner*—Marcos D. Pizarro
*Assistant Examiner*—Eva Yan Montalvo
(74) *Attorney, Agent, or Firm*—Jianq Chyun IP Office

(57) ABSTRACT

A stacked type chip package structure including a backplate, a circuit substrate, a first chip, a second chip, and a conductive film is provided. The backplate comprises a circuit layer. The circuit substrate is disposed on the backplate, and has an upper surface and an opposite lower surface. Besides, the circuit substrate has a receiving hole corresponding to the backplate. The first chip is disposed inside the receiving hole, and the first chip is electrically connected to the circuit substrate through the circuit layer of the backplate. The second chip is disposed above the first chip, and is electrically connected to the circuit substrate. The conductive film is disposed between the first chip and the second chip, wherein the conductive film is electrically connected to a ground of the circuit substrate.

12 Claims, 5 Drawing Sheets

STACKED TYPE CHIP PACKAGE STRUCTURE

BACKGROUND OF THE INVENTION

1. Field of the Invention

The present invention generally relates to a stacked type chip package structure, and more particularly, to a stacked type chip package structure having a RF (radio frequency) chip.

2. Description of Related Art

In accordance with the highly advanced telecommunication in our modern society, the chip structure has to be developed in response to the influence of electronic equipment being digitized, network applicable, locally connectable, and humanized for the electronic equipment. To achieve the above objectives, high processing speed, multi-functional, integration, small volume, light weight, and low cost are all required. Nowadays, many electronic devices must use RF chips with other kinds of chips, such as RF chip in conjunction with digital IC, digital signal processor (DSP), or base band (BB) chip, for achieving the purposes of small volume and high processing speed. However, since RF chips belong to high frequency chips, electromagnetic shielding is required in order to avoid signal interference.

FIG. 1 is a schematic cross-section view showing a conventional stacked type chip package structure. Referring to FIG. 1, a conventional stacked type chip package structure 100 comprises a carrier 110, a first chip 120, a second chip 130, and a metallic plate 140. The carrier 110 has an upper surface 112 and a lower surface 114. The first chip 120 is disposed on the upper surface 112 of the carrier 110, and is electrically connected thereto. The second chip 130, which is disposed above the first chip 120, is a RF chip, and is electrically connected to the carrier 110. The metallic plate 140 is sandwiched between the first chip 120 and the second chip 130, and is electrically connected to a ground 150, for preventing the RF chip from signal interference. However, the metallic plate 140 between the first chip 120 and the second chip 130 may cause an increase in total thickness of the stacked type chip package structure 100, and this may not satisfy the demands for small volume and light weight of electronic devices.

SUMMARY OF THE INVENTION

Accordingly, the present invention is directed to a stacked type chip package structure. The chip package structure is to stack a second chip (such as a base band chip) on top of a first chip (such as a RF chip) and to use a conductive film or an interposer electrically connected to a ground, to protect the RF chip from signal interference. Since the RF chip is placed within a receiving hole of a circuit substrate, the total thickness of the chip package structure would not be increased.

The present invention provides a stacked type chip package structure. The stacked type chip package structure mainly comprises a backplate, a circuit substrate, a first chip, a second chip, and a conductive film. The backplate comprises a circuit layer. The circuit substrate is disposed on the backplate, and has an upper surface and an opposite lower surface. Besides, the circuit substrate has a receiving hole corresponding to the backplate. The first chip is disposed inside the receiving hole, and the first chip is electrically connected to the circuit substrate through the circuit layer of the backplate. The second chip is disposed above the first chip, and is electrically connected to the circuit substrate. The conductive film is disposed between the first chip and the second chip, wherein the conductive film is electrically connected to a ground of the circuit substrate.

According to an embodiment of the present invention, the circuit substrate comprises a plurality of solder balls on the lower surface thereof.

According to an embodiment of the present invention, the first chip comprises a RF chip.

According to an embodiment of the present invention, the first chip is electrically connected to the circuit layer of the backplate through flip chip technique.

According to an embodiment of the present invention, the second chip comprises a digital IC, a digital signal processor, or a base band chip.

According to an embodiment of the present invention, the second chip is electrically connected to the circuit substrate through wire bonding technique or flip chip technique.

According to an embodiment of the present invention, the conductive film is made of conductive glue.

According to an embodiment of the present invention, the stacked type chip package structure further comprises an encapsulant. The encapsulant is arranged on the upper surface of the circuit substrate, to cover the second chip and be filled among the circuit substrate, the backplate, and the first chip.

The present invention also provides a stacked type chip package structure. The stacked type chip package structure mainly comprises a backplate, a circuit substrate, a first chip, a second chip, and an interposer. The backplate comprises a circuit layer. The circuit substrate is disposed on the backplate, and has an upper surface and an opposite lower surface. Besides, the circuit substrate has a receiving hole corresponding to the backplate. The first chip is disposed inside the receiving hole, and the first chip is electrically connected to the circuit substrate through the circuit layer of the backplate. The second chip is disposed above the first chip, and is electrically connected to the circuit substrate. The interposer is disposed between the first chip and the second chip, and is electrically connected to a ground of the circuit substrate.

According to an embodiment of the present invention, the circuit substrate comprises a plurality of solder balls on the lower surface thereof.

According to an embodiment of the present invention, the first chip comprises a RF chip.

According to an embodiment of the present invention, the first chip is electrically connected to the circuit layer of the backplate through flip chip technique.

According to an embodiment of the present invention, the backplate and the interposer are disposed against the lower surface and the upper surface of the circuit substrate, respectively.

According to an embodiment of the present invention, the second chip comprises a digital IC, a digital signal processor, or a base band chip.

According to an embodiment of the present invention, the second chip is electrically connected to the circuit substrate by wire bonding technique.

According to an embodiment of the present invention, the stacked type chip package structure further comprises an encapsulant. The encapsulant is arranged on the upper surface of the circuit substrate, to cover the second chip and be filled among the circuit substrate, the backplate, and the first chip.

According to an embodiment of the present invention, a gap exists between the interposer and the circuit substrate, and the interposer is electrically connected to the ground of the circuit substrate by flip chip or wire bonding technique.

According to an embodiment of the present invention, the interposer is fixed on the first chip by an adhesive.

According to an embodiment of the present invention, the second chip is fixed on the interposer by an adhesive.

In summary, the stacked type chip package structure of the present invention is to stack a second chip (such as a base band chip) on top of a first chip (such as a RF chip), and to use a conductive film or an interposer electrically connected to a ground. Since the conductive film or the interposer is connected to the ground, the electromagnetic interference (EMI) generated from the second chip may be eliminated, thus protecting the first chip from signal interference. Besides, since the RF chip is placed within the receiving hole of the circuit substrate, the total thickness of the chip package structure would not be increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
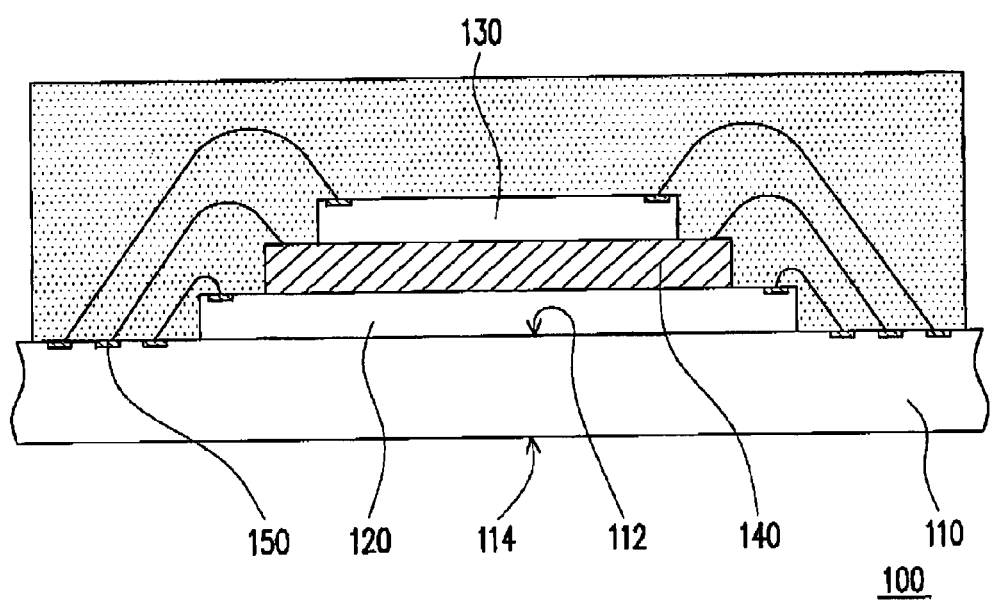
FIG. 1 is a schematic cross-section view showing a conventional stacked type chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
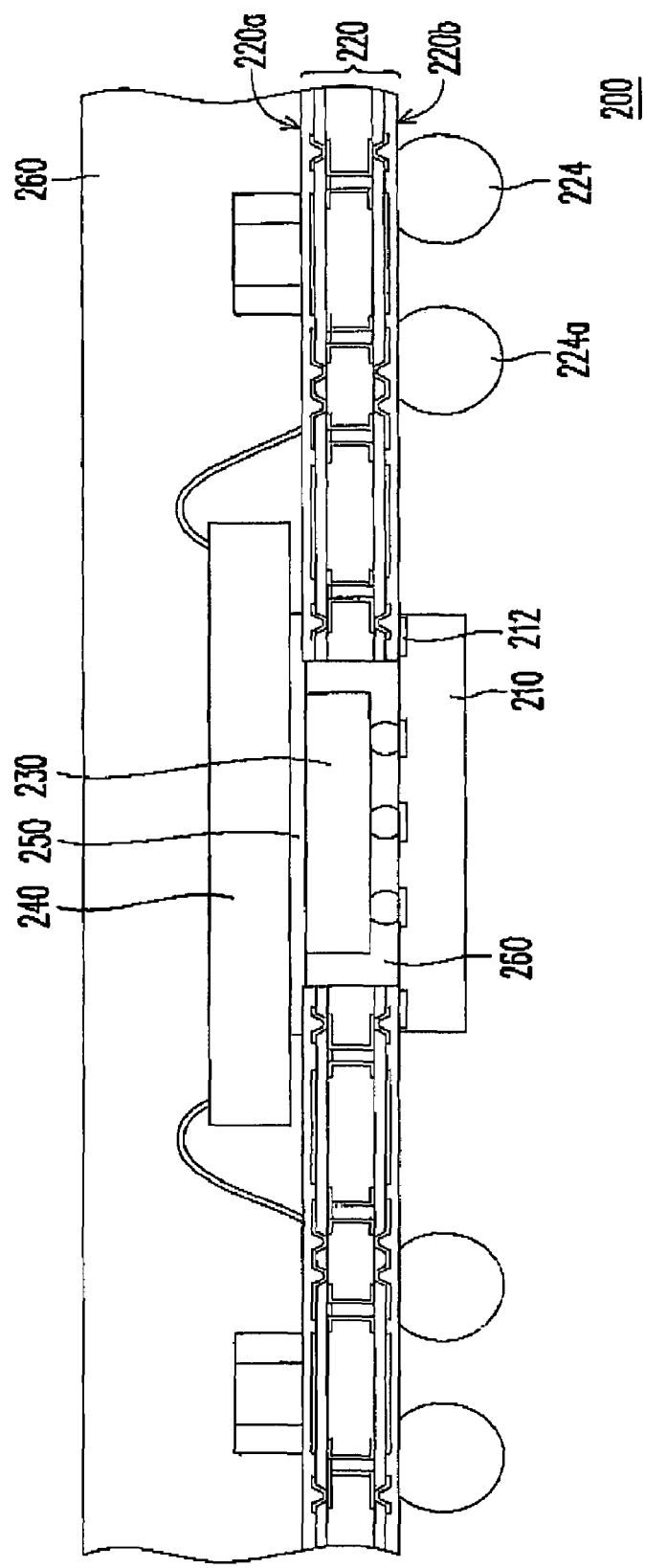
FIG. 2 is a schematic cross-section view showing a stacked type chip package structure according to the first embodiment of the present invention.

FIG. 2 is a schematic cross-section view showing a stacked type chip package structure according to the first embodiment of the present invention. The stacked type chip package structure 200 mainly comprises a backplate 210, a circuit substrate 220, a first chip 230, a second chip 240, and a conductive film 250. The backplate 210 comprises a circuit layer 212 on the upper surface of the backplate 210. The circuit substrate 220 is disposed on the backplate 210, and has an upper surface 220a and an opposite lower surface 220b. The circuit substrate 220 has a receiving hole 222 corresponding to the backplate 210 for receiving the first chip 230. The circuit substrate 220 may be replaced by a printed circuit board (PCB), a chip carrier and so on. Besides, a plurality of solder balls 224 may be optionally formed on the lower surface 220b of the circuit substrate 220, such that the stacked type chip package structure 200 may be electrically connected to other electronic devices through these solder balls 224.

The first chip 230 is a RF chip, and is disposed on the backplate 210 and inside the receiving hole 222. The first chip 230 is electrically connected to the circuit substrate 220 through the circuit layer 212 of the backplate 210. In this embodiment, the first chip 230 is electrically connected to the circuit layer 212 of the backplate 210 through flip chip technique. The second chip 240 is disposed above the first chip 230, and is electrically connected to the circuit substrate 220. In this embodiment, the second chip 240 may be a digital IC, a DSP, or a base band chip, and the second chip 240 is electrically connected to the circuit substrate 220 through wire bonding technique. However, the second chip 240 may be electrically connected to the circuit substrate 220 through other manners, such as flip chip technique. The method for electrically connecting the second chip 240 and the circuit substrate 220 is not limited in the present invention. The conductive film 250 is disposed between the first chip 230 and the second chip 240, and is electrically connected to a ground 224a of the circuit substrate 220 for preventing the RF chip from being affected by the base band chip. The conductive film 250 may be made of conductive glue, such as conductive epoxy, and is also used to fix the second chip 240 on top of the first chip 230.

Besides, the stacked type chip package structure 200 may further comprise an encapsulant 260 arranged on the upper surface 220a of the circuit substrate 220. The encapsulant 260 covers the second chip 240, and is filled among the circuit substrate 220, the backplate 210, and the first chip 230, thus protecting these components from humidity and damage. Since the conductive film 250 is connected to the ground 224a through the circuit substrate 220, the EMI generated from the second chip 240 (such as the base band chip) may be eliminated, thus protecting the first chip 230 (such as the RF chip) from being affected by the second chip 240.

Figure 3:
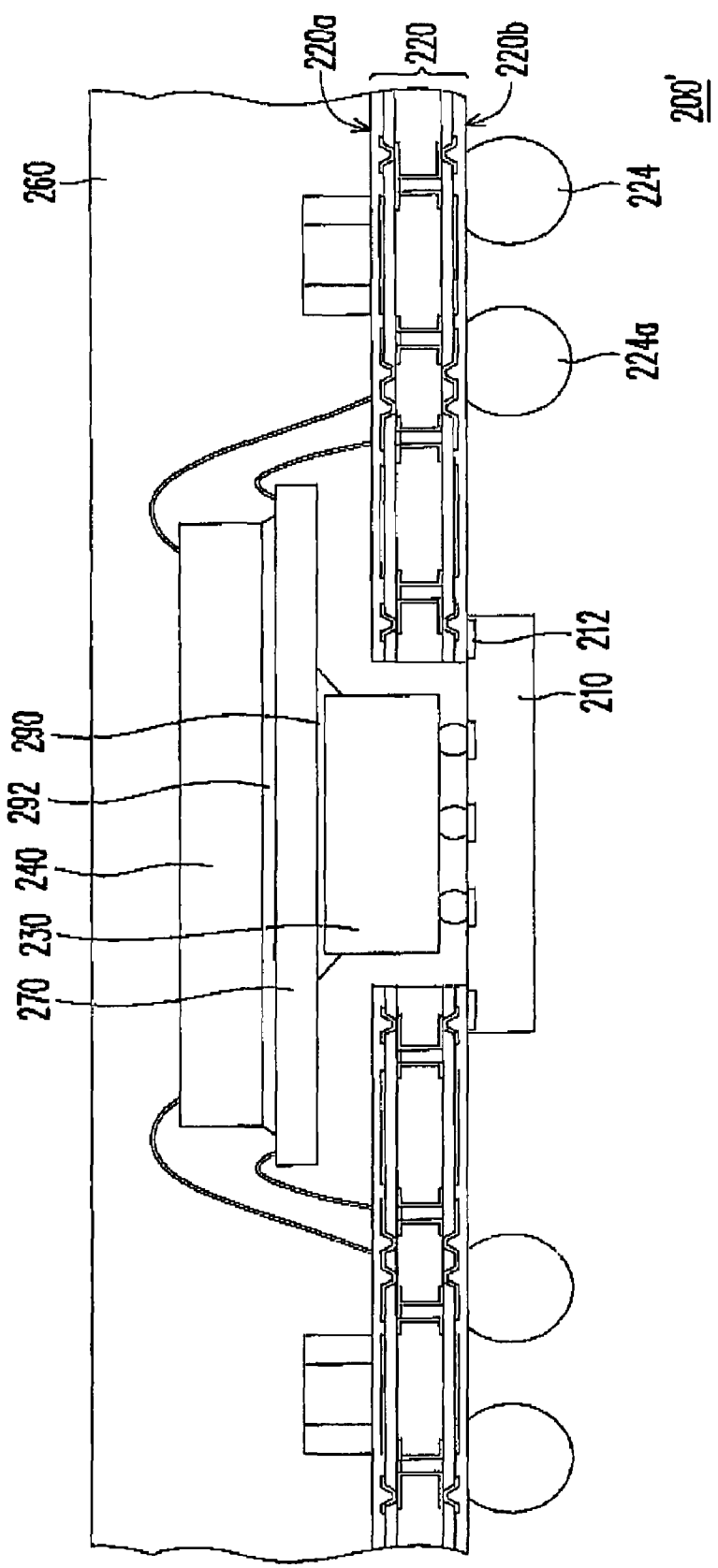
FIG. 3 is a schematic cross-section view showing a stacked type chip package structure according to the second embodiment of the present invention.
Figure 4:
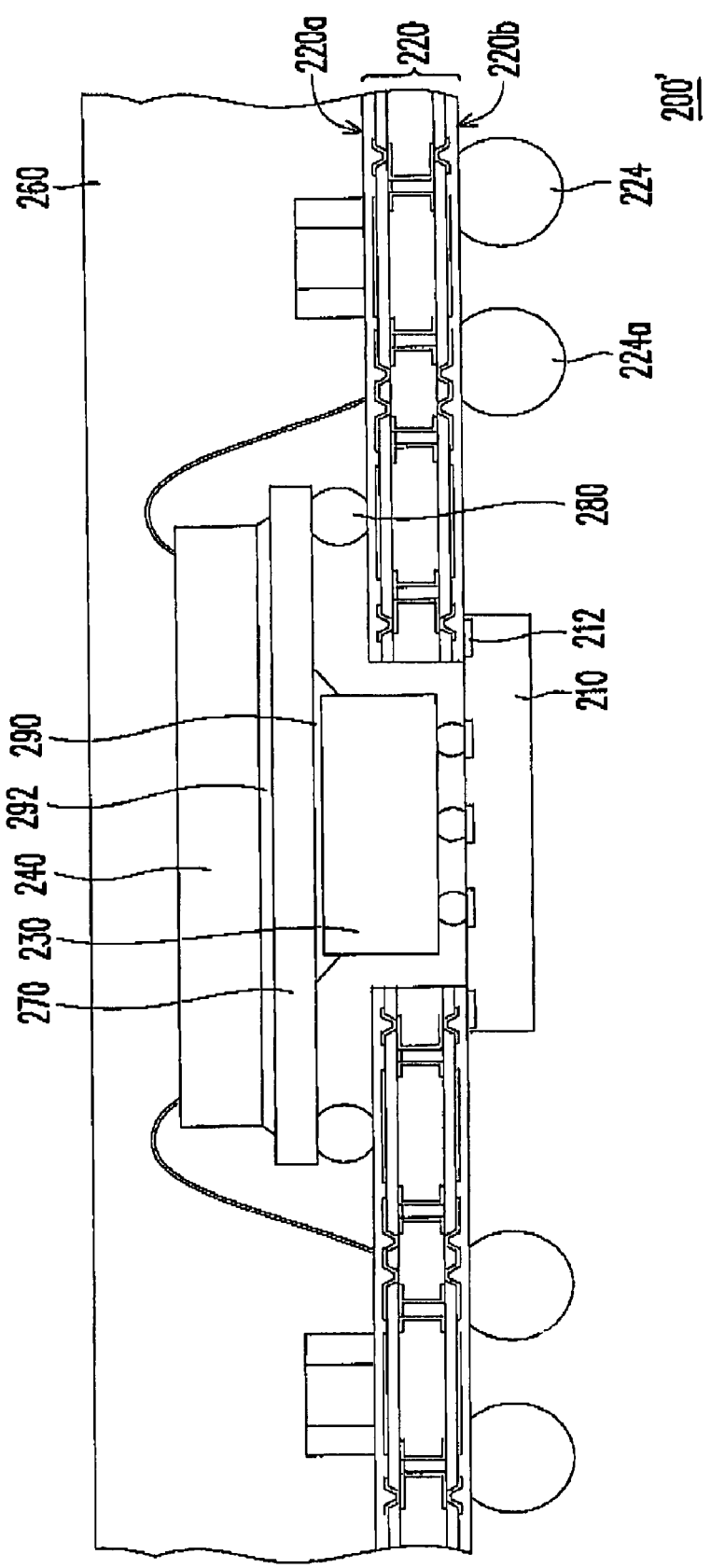
FIG. 4 is a schematic cross-section view showing a stacked type chip package structure according to another embodiment of the present invention.

FIG. 3 is a schematic cross-section view showing a stacked type chip package structure according to the second embodiment of the present invention. Referring to FIG. 3, most of the components of the stacked type chip package structure 200' are similar to those of the stacked type chip package structure 200 as shown in FIG. 2, and the difference between them is that an interposer 270 is used to replace the conductive film 250 as shown in FIG. 2. In this embodiment, the interposer 270 is disposed between the first chip 230 and the second chip 240. More specifically, a gap exists between the interposer 270 and the circuit substrate 220, and the interposer 270 is electrically connected to a ground (not shown) of the circuit substrate 220 by wire bonding technique. However, the interposer 270 may be electrically connected to a ground (not shown) of the circuit substrate 220 by bumps 280 as shown in FIG. 4. The method for electrically connecting the interposer 270 and the circuit substrate 220 is not limited in the present invention.

Figure 5:
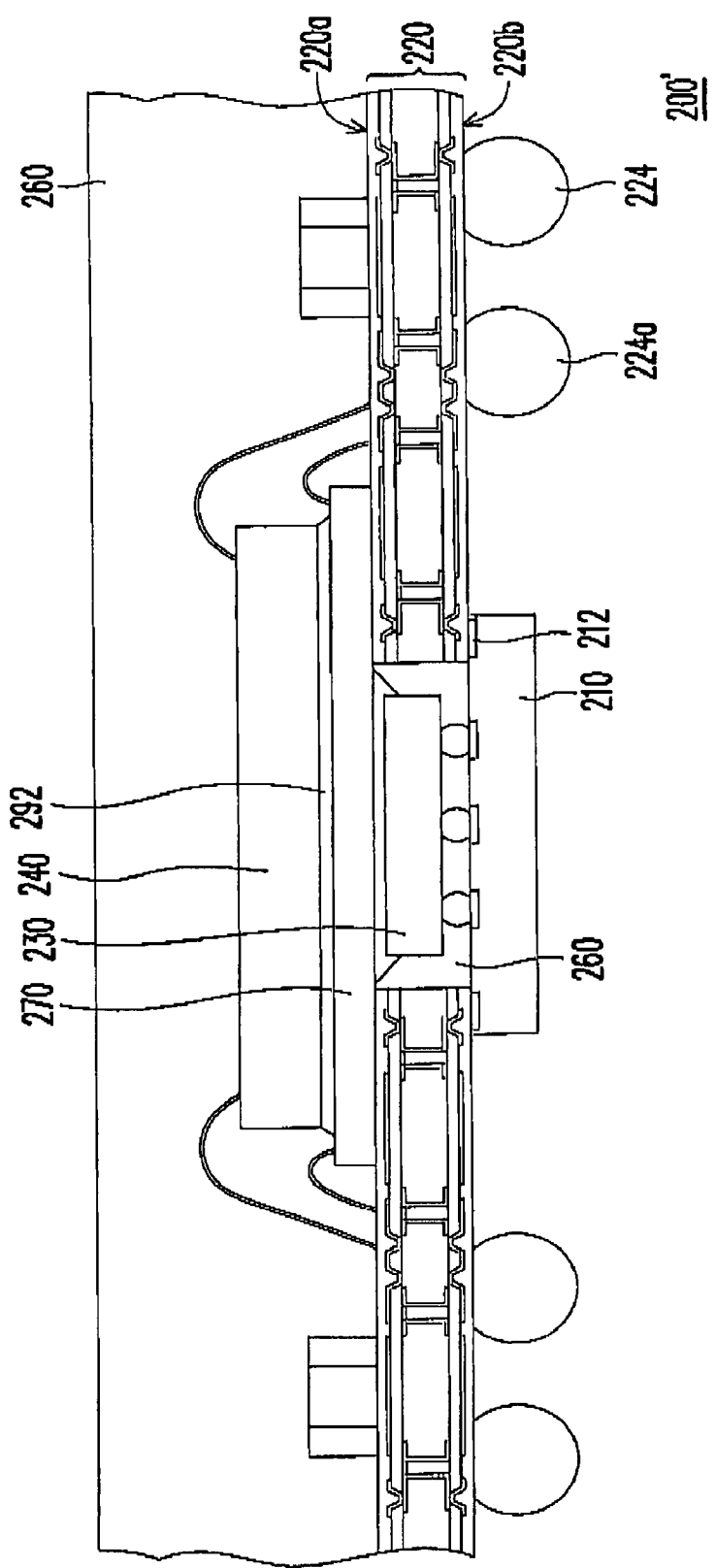
FIG. 5 is a schematic cross-section view showing a stacked type chip package structure according to another embodiment of the present invention.

Besides, the interposer 270 is fixed on top of the first chip 230 by an adhesive 290, and the second chip 240 is fixed on top of the interposer 270 by an adhesive 292 in this embodiment. Furthermore, if the thickness of the first chip 230 is thinner as shown in FIG. 5, the backplate 210 and the interposer 270 may be disposed against the lower surface 220b and the upper surface 220a of the circuit substrate 220, respectively, and this may further reduce the total thickness of the stacked type chip package structure 200'.

In summary, the stacked type chip package structure of the present invention is to stack the second chip (such as a base band chip) on top of the first chip (such as a RF chip) and to use a conductive film or an interposer electrically connected to a ground, to protect the first chip from being affected by the second chip. Since the first chip is placed within the receiving hole of the circuit substrate, the total thickness of the chip package structure can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked type chip package structure, comprising:
a backplate, comprising a circuit layer disposed on a top surface of the backplate;
a circuit substrate, disposed on the backplate, wherein the circuit substrate has an upper surface and an opposite lower surface, a portion of the lower surface of the circuit substrate is in physical contact with the top surface of the backplate, while another portion of the lower surface of the circuit substrate is exposed, and the circuit substrate has a receiving hole that is covered by the backplate;
a first chip, disposed inside the receiving hole, wherein the first chip is electrically connected to the circuit substrate through the circuit layer of the backplate;
a second chip, disposed above the first chip, and electrically connected to the circuit substrate; and
an interposer, disposed between the first chip and the second chip, wherein a size of the interposer is smaller than that of the circuit substrate and the interposer is electrically connected to a ground of the circuit substrate by wire bonding technique.

2. The stacked type chip package structure according to claim 1, wherein the circuit substrate comprises a plurality of solder balls disposed on the exposed portion of the lower surface thereof.

3. The stacked type chip package structure according to claim 1, wherein the first chip comprises a RF chip.

4. The stacked type chip package structure according to claim 1, wherein the first chip is electrically connected to the circuit layer of the backplate through flip chip technique.

5. The stacked type chip package structure according to claim 1, wherein the backplate and the interposer are disposed against the lower surface and the upper surface of the circuit substrate, respectively.

6. The stacked type chip package structure according to claim 1, wherein the second chip comprises a digital IC, a digital signal processor, or a base band chip.

7. The stacked type chip package structure according to claim 1, wherein the second chip is electrically connected to the circuit substrate by wire bonding technique.

8. The stacked type chip package structure according to claim 1, further comprising an encapsulant, wherein the encapsulant is arranged on the upper surface of the circuit substrate to cover the second chip and be filled among the circuit substrate, the backplate, and the first chip.

9. The stacked type chip package structure according to claim 1, wherein a gap exists between the interposer and the circuit substrate.

10. The stacked type chip package structure according to claim 1, wherein the interposer is fixed on the first chip by an adhesive.

11. The stacked type chip package structure according to claim 1, wherein the second chip is fixed on the interposer by an adhesive.

12. The stacked type chip package structure according to claim 1, wherein the first chip is attached to the interposer by a conductive film.

* * * * *